United States Patent

Iwanari et al.

[11] Patent Number: 5,841,727
[45] Date of Patent: Nov. 24, 1998

[54] SEMICONDUCTOR MEMORY DEVICE

[75] Inventors: Shunichi Iwanari; Hirohito Kikukawa, both of Osaka, Japan

[73] Assignee: Matsushita Electronics Corporation, Osaka, Japan

[21] Appl. No.: 867,855

[22] Filed: Jun. 3, 1997

[30] Foreign Application Priority Data

Jun. 4, 1996 [JP] Japan .................................. 8-141309

[51] Int. Cl.$^6$ ...................................................... G11C 8/00

[52] U.S. Cl. .............................. 365/230.03; 365/230.08; 365/230.06

[58] Field of Search ........................ 365/230.03, 230.06, 365/230.08

[56] References Cited

U.S. PATENT DOCUMENTS

| | | | |
|---|---|---|---|
| 5,717,651 | 2/1998 | Kikukawa et al. ...................... | 365/233 |
| 5,726,947 | 3/1998 | Yamayaki et al. .................. | 365/230.03 |

OTHER PUBLICATIONS

Sakai, et al. "Development of 100MHz Synchronous DRAM Using Pipelined Architecture," Technical Report of Information and Communication Engineers, vol. 94, Paper No. ICD94–38. May 1994. pp. 33–39.

Primary Examiner—Vu A. Le
Attorney, Agent, or Firm—Stevens, Davis, Miller & Mosher, L.L.P.

[57] ABSTRACT

To restrain an increase in power consumption and a reduction in access speed, the following structure is adopted: An address is input to a row address input circuit and in correspondence with a row address output from the row address input circuit, a predecode signal is output from a row predecode circuit. An address is input to a block-select-signal generating circuit from which first and second block select signals are output for selecting either one of the first and second memory cell array blocks. First and second predecode-signal hold circuits provided in correspondence with the first and second memory cell array blocks hold predecode signals. First and second predecode signals held by the first and second predecode signal hold circuits are supplied to first and second row decode circuits, respectively, and the first and second predecode-signal hold circuits corresponding to the first and second block select signals update the contents being held.

3 Claims, 4 Drawing Sheets

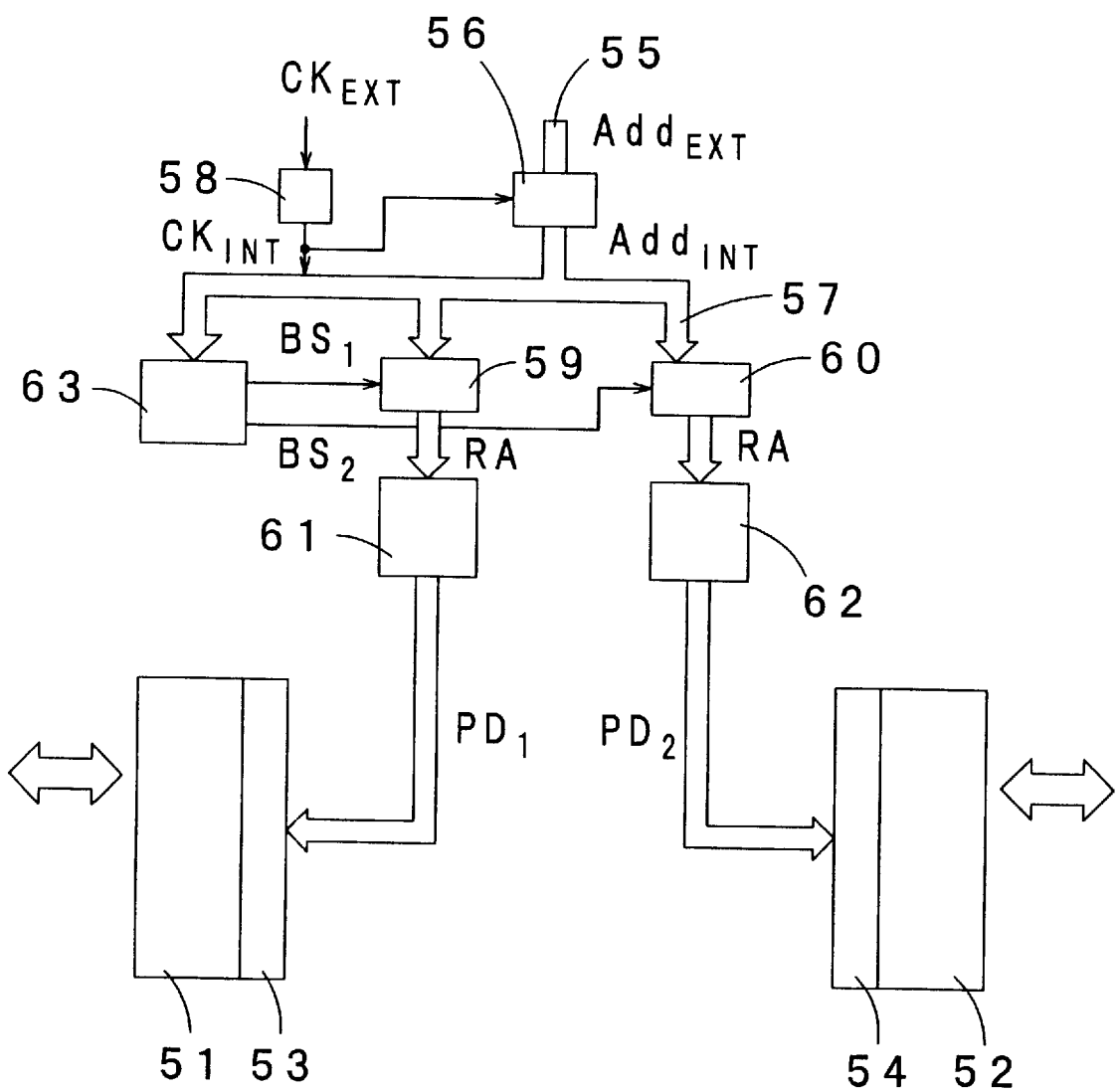

SEMICONDUCTOR MEMORY DEVICE

BACKGROUND OF THE INVENTION

1. Field of the invention

The present invention relates to a semiconductor memory device called a synchronous dynamic random access memory (DRAM) which is one of the semiconductor integrated circuits, and particularly, to the structures of address input and select circuits. More specifically, the present invention relates to the structures of address input and select circuits in a semiconductor memory device comprising one chip divided into a plurality of memory cell array blocks.

2. Description of the Prior Art

In recent years, it has been desired that the data transfer speed of main memories be higher as micro processing units (MPUs) have become faster. On the other hand, in order to fill the performance gap with the MPUs, a synchronous DRAM has been developed as a memory capable of high-speed data transfer.

In memories realizing such high-speed data transfer, in order to realize continuous and high-speed data input and output on one chip, a semiconductor chip is divided into a plurality of memory cell array blocks which are accessed independently of one another. That is, in these memories, burst mode and interleaving are combined on one chip to realize a structure equivalent to the structure having a plurality of general-purpose memories on one-chip. By independently and alternately accessing the plurality of memory cell array blocks, high-speed data transfer is enabled (See "Technical Report of Information and Communication Engineers" Vol. 94, No. 75, Paper No. ICD94-38, Sakai et al. "Development of 100 MHz Synchronous DRAM Using Pipelined Architecture").

FIG. 4 is a schematic block diagram showing the structure of a part of a conventional semiconductor memory device of this type which part makes accesses to row addresses. The semiconductor memory device has, as shown in FIG. 4, a plurality of memory cell array blocks, for example, two memory cell array blocks 51 and 52 which have row decode circuits 53 and 54, respectively, at their row address inputs for selecting a word line.

Moreover, the semiconductor memory device has an address buffer 56 for holding an external address Add$_{EXT}$ on an external address bus 55. To the output of the address buffer 56, an internal address bus 57 is connected.

Further, the semiconductor memory device has a clock generating circuit 58 fed with an external clock CK$_{EXT}$ to generate an internal clock CK$_{INT}$ which is supplied from the clock generating circuit 58 to the address buffer 56 and other circuits.

Row address input circuits 59 and 60 are provided in a one-to-one correspondence with the memory cell array blocks 51 and 52, respectively, and are fed with the internal address Add$_{INT}$ on the internal address bus 57 to hold a row address RA.

Row predecode circuits 61 and 62 predecode the row address RA output from the row address input circuits 59 and 60 and supply predecode signals PD$_1$ and PD$_2$ to the row decode circuits 53 and 54, respectively.

In order to select either one of the memory cell array blocks 51 and 52, a block-select-signal generating circuit 63 is fed with the internal address Add$_{INT}$ on the internal address bus 57 and generates block select signals BS$_1$ and BS$_2$ to selectively activate the row address input circuits 59 and 60.

An operation of a semiconductor memory device thus structured will hereinafter be described. In the semiconductor memory device, in accordance with the internal clock CK$_{INT}$ of the clock generating circuit 58, the address buffer 56 captures the external address Add$_{EXT}$ on the external address bus 55 to hold it. From the address buffer 56, the internal address Add$_{INT}$ is output onto the internal address bus 57. The block-select-signal generating circuit 63 activates either one of the block select signals BS$_1$ and BS$_2$ based on the internal address Add$_{INT}$ on the internal address bus 57 to select either one of the memory cell array blocks 51 and 52.

Of the block select signals BS$_1$ and BS$_2$, when the block select signal BS$_1$, for example, is activated based on the condition of the internal address Add$_{INT}$, the row address input circuit 59 is actuated and captures the row address RA of the internal address Add$_{INT}$ to update and hold it. The row address RA being held is supplied to the row predecode circuit 61 which predecodes the row address RA supplied from the row address input circuit 59 and supplies it to the row decode circuit 53. This causes the row decode circuit 53 to access a predetermined memory cell of the memory cell array block 51 to read or write data.

When the block select signal BS$_2$ is activated based on the condition of the internal address Add$_{INT}$, the row address input circuit 60 is actuated and captures the row address RA of the internal address Add$_{INT}$ to update and hold it. The row address RA being held is supplied to the predecode circuit 62 which predecodes the row address RA supplied from the row address input circuit 60 and supplies it to the row decode circuit 54. This causes the row decode circuit 54 to access a predetermined memory cell of the memory cell array block 52 to read or write data.

Then, the memory cell array blocks 51 and 52 are alternately accessed. In the burst mode, by successively changing the column address by a counter at the same row address RA, a group of data at the same row address RA but at different column addresses are continuously read or written within the same memory cell array block 51 or 52.

In the semiconductor memory device thus structured, after the external address signal Add$_{EXT}$ is input, the block to be accessed first is selected based on the block select signals BS$_1$ and BS$_2$ of the block-select-signal generating circuit 63. Then, the address decode operation is performed by the row address input circuit 59 and the row predecode circuit 61.

In the refresh operation, the row address input circuits 59 and 60 and the row predecode circuits 61 and 62 provided in correspondence with the memory cell array blocks 51 and 52, respectively, are all actuated because the refresh operation is performed in all of the memory cell array blocks 51 and 52.

The above-described circuit structure in which the address decode system circuits, i.e. the row address input circuits 59 and 60 and the row predecode circuits 61 and 62 are provided in a one-to-one correspondence with the memory cell array blocks 51 and 52 has the following two disadvantages compared with general-purpose memories: an increase in current consumption, in particular, in the refresh operation due to an increase in the number of elements of the address decode system circuits; and a reduction in access speed because of the address decode operation being performed after the memory cell array block 51 or 52 is selected. The number of elements of the address decode system circuits increases by a factor of the number of memory cell array blocks into which the chip is divided.

SUMMARY OF THE INVENTION

A first object of the present invention is to provide a semiconductor memory device capable of restraining the increase in current consumption.

A second object of the present invention is to provide a semiconductor memory device capable of restraining the reduction in access speed.

A semiconductor memory device according to a first invention is provided with: a plurality of memory cell array blocks; one address input circuit for inputting thereto an address common to the plurality of memory cell array blocks; an address select circuit for outputting a memory cell select signal common to the plurality of memory cell array blocks in correspondence with an address output from the address input circuit; a block-select-signal generating circuit for generating a block select signal to select one of the plurality of memory cell array blocks; and a plurality of memory-select-signal hold circuits provided for the plurality of memory cell array blocks, respectively, for holding the memory cell select signal and supplying the memory cell select signal being held to the plurality of memory cell array blocks, wherein said plurality of memory-select-signal hold circuits update contents being held in response to the block select signal corresponding to the plurality of memory cell array blocks.

According to the semiconductor memory device, in the refresh operation of the plurality of memory cell array blocks, by actuating the address input circuit and the address select circuit common to the memory cell array blocks so that the block-select-signal generating circuit is brought to an all-selected-state, it is made possible to access all of the memory cell array blocks at a time, so that a plurality of memory cell array blocks can be refreshed at a time. At this time, although the memory-select-signal circuits are actuated, their power consumption is much lower than that of the address input circuit and the address select circuit and only one pair of the address input circuit and the address select circuit are actuated, so that the reduction in power consumption is achieved.

Specifically, the address input circuit and the address select circuit are common to the plurality of memory cell array blocks, the plurality of memory-select-signal hold circuits for holding the output of the address select circuit are provided in correspondence with the plurality of memory cell array blocks, and the contents being held are updated only with respect to one of the memory-select-signal hold circuits corresponding to the block select signal. Thus, since only one address input circuit and one address select circuit are actuated in the refresh operation, current consumption during the refresh operation is reduced, so that the reduction in power consumption is achieved.

In the normal operation, since the actuation of the memory-select-signal hold circuits for holding the output of the address select circuit is controlled by the block-select-signal generating circuit, the actuation of the address input circuit and the address select circuit and the actuation of the block-select-signal generating circuit can be performed at a time, so that the reduction in access speed is restrained.

A semiconductor memory device according to a second invention is characterized in that in the semiconductor memory device according to the first invention, the memory cell select signal of the address select circuit is supplied to the address input circuit as an initialization signal.

According to this feature, the address input circuit and the address select circuit are initialized by using the memory cell select signal of the address select circuit and not by delaying another signal. Consequently, to produce the initialization signal, it is unnecessary to provide another circuit such as a delay circuit, so that the number of elements is reduced to achieve the reduction in power consumption.

A semiconductor memory device according to a third invention is characterized in that in a semiconductor memory device according to the first or the second invention, the address input circuit is a row address input circuit and the address select circuit is a row address select circuit.

According to this feature, advantages similar to those of the semiconductor memory device according to the first or the second invention are obtained.

BRIEF DESCRIPTION OF THE DRAWINGS

FIG. 4 is a schematic block diagram showing the structure of a conventional semiconductor memory device.

DESCRIPTION OF THE PREFERRED EMBODIMENT

Figure 1:
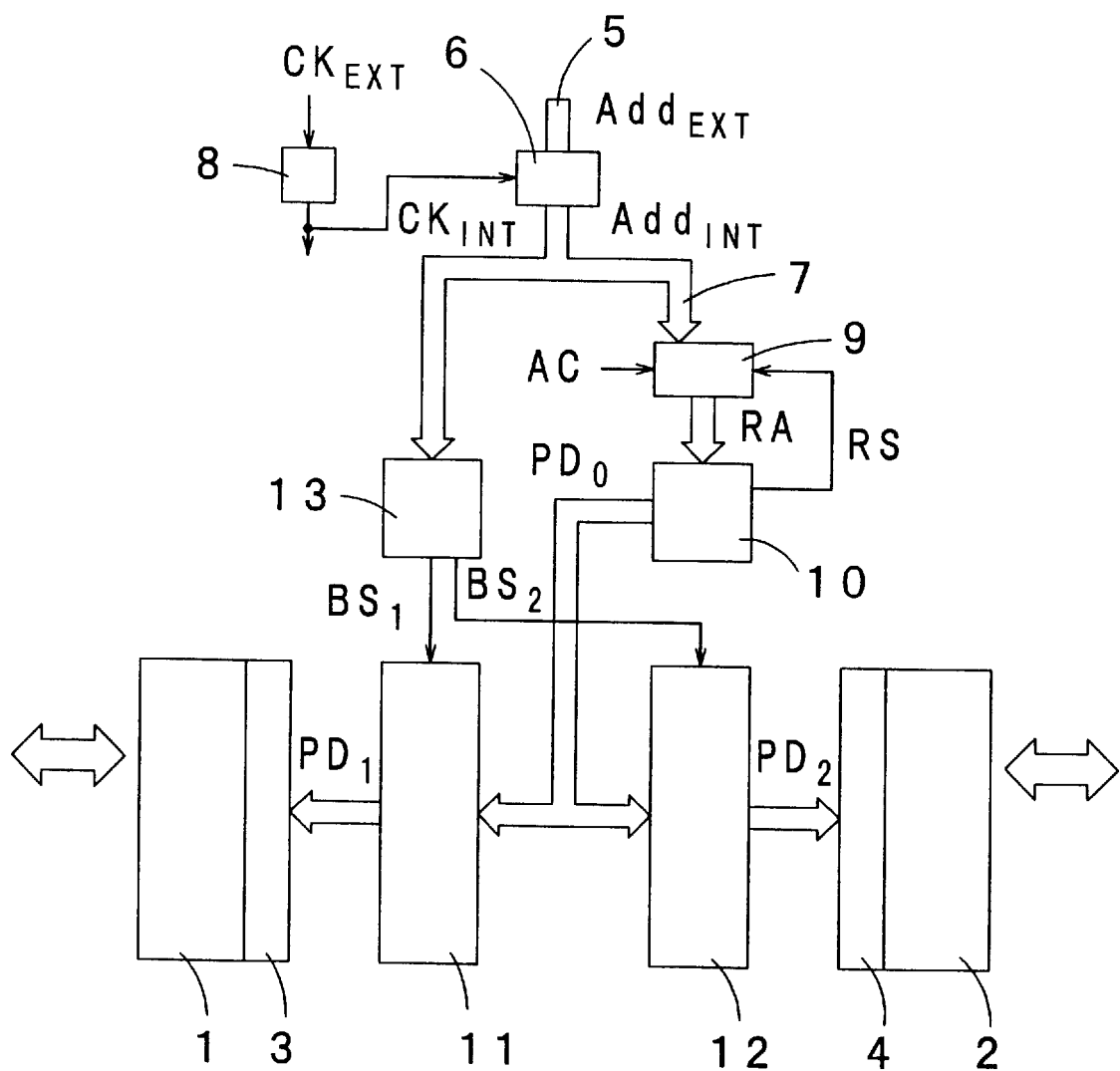
FIG. 1 is a schematic block diagram showing the structure of a semiconductor memory device according to an embodiment of the present invention.

FIG. 1 is a schematic block diagram showing the structure of a part of a semiconductor memory device according to an embodiment of the present invention which part makes accesses to row addresses. The semiconductor memory device has, as shown in FIG. 1, a plurality of memory cell array blocks, for example, two memory cell array blocks 1 and 2 which have row decode circuits 3 and 4, respectively, at their row address inputs for selecting a word line.

Moreover, the semiconductor memory device has an address buffer 6 for holding an external address $Add_{EXT}$ on an external address bus 5. To the output of the address buffer 6, an internal address bus 7 is connected.

Further, the semiconductor memory device has a clock generating circuit 8 fed with an external clock $CK_{EXT}$ to generate an internal clock $CK_{INT}$ which is supplied from the clock generating circuit 8 to the address buffer 6 and other circuits.

A row address input circuit 9 is fed with an internal address $Add_{INT}$ on an internal address bus 7 in response to an address capture signal AC and holds the internal address $Add_{INT}$. Only one row address input circuit 9 is provided to be common to the memory cell array blocks 1 and 2.

A row predecode circuit 10 functioning as an address select circuit is provided for predecoding a row address RA output from the row address input circuit 9. Only one row predecode circuit 10 is provided to be common to the memory cell array blocks 1 and 2. The row predecode circuit 10 outputs a predecode signal $PD_0$ as a memory cell select signal and after supplying the predecode signal $PD_0$, supplies a reset signal RS to the row address input circuit 9 to initialize the row address input circuit 9, thereby initializing the row predecode circuit 10 itself.

Row-predecode-signal hold circuits 11 and 12 functioning as memory-select-signal hold circuits are provided in correspondence with the memory cell array blocks 1 and 2, respectively, for holding the predecode signal $PD_0$. The row-predecode-signal hold circuit 11 outputs a predecode signal $PD_1$ and the row-predecode-signal hold circuit 12 outputs a predecode signal $PD_2$.

In order to select either one of the memory cell array blocks 1 and 2, a block-select-signal generating circuit 13 is fed with the internal address $Add_{INT}$ on the internal address bus 7 to generate block select signals $BS_1$ and $BS_2$, thereby selectively executing the update operation of the row-predecode-signal hold circuits 11 and 12.

An operation of the semiconductor memory device thus structured will hereinafter be described. In the semiconductor memory device, the address buffer 6 captures the external address $Add_{EXT}$ on the external address bus 5 in accordance with the internal clock $CK_{INT}$ of the clock generating circuit 8 and holds the address $Add_{EXT}$. From the address buffer 6, the internal address $Add_{INT}$ is output onto the internal address bus 7.

The row address input circuit 9 is actuated in response to the address capture signal AC and captures the row address RA of the internal address $Add_{INT}$ to hold it. The row address RA being held is supplied to the row predecode circuit 10 which predecodes the row address RA supplied from the row address input circuit 9 and supplies a predecode signal $PD_0$ to the row-predecode-signal hold circuits 11 and 12.

Paralleling the series of address input and predecode operations described above, the block-select-signal generating circuit 13 activates either one of the block select signals $BS_1$ and $BS_2$ based on the internal address $Add_{INT}$ on the internal address bus 7 to select either one of the memory cell array blocks 1 and 2.

Of the block select signals $BS_1$ and $BS_2$, when the block select signal $BS_1$, for example, is activated based on the condition of the internal address $Add_{INT}$, the row-predecode-signal hold circuit 11 performs an update operation to capture and hold the predecode signal $PD_0$ and supplies it to the row decode circuit 3 which decodes the predecode signal $PD_1$ supplied from the row-predecode-signal hold circuit 11, so that the row decode circuit 3 accesses a predetermined memory cell of the memory cell array block 1 to read or write data. At this time, the row-predecode-signal hold circuit 12 does not perform an update operation.

When the block select circuit $BS_2$ is activated based on the condition of the internal address $Add_{INT}$, the row-predecode-signal hold circuit 12 performs the update operation to capture and hold the predecode signal $PD_0$ and supplies it to the row decode circuit 4 which decodes the predecode signal $PD_2$ supplied from the row-predecode-signal hold circuit 12, so that the row decode circuit 4 accesses a predetermined memory cell of the memory cell array block 2 to read or write data. At this time, the row-predecode-signal hold circuit 11 does not perform the update operation.

Then, the memory cell array blocks 1 and 2 are alternately accessed. In the burst mode, by successively changing the column address by a counter at the same row address RA, a group of data at the same row address RA but at different column addresses are continuously read or write within the same memory cell array block 1 or 2.

In this structure, after the external address signal $Add_{EXT}$ is input, paralleling the decode operations by the row address input circuit 9 and the row predecode circuit 10, the block select signals $BS_1$ and $BS_2$ for selecting the block to be accessed are generated by the block-select-signal generating circuit 13.

In the refresh operation, when the refresh operation is performed in all of the memory cell array blocks 1 and 2, the row address input circuit 9 and the row predecode circuit 10 provided to be common to the memory cell array blocks 1 and 2 are actuated, so that all of the row-predecode-signal holding circuits 11 and 12 simultaneously select all of the memory cell array blocks 1 and 2. This allows the update and hold operations of the row-predecode-signal hold circuits 11 and 12 to be simultaneously performed. As a result, the refresh operation is simultaneously performed for all of the memory cell array blocks 1 and 2.

As described above, the semiconductor memory device is structured such that the row address input circuit 9 and the row predecode circuit 10 are provided to be common to the plurality of memory cell array blocks 1 and 2, that the plurality of row-predecode-signal hold circuits 11 and 12 for holding the output of the row predecode circuit 10 are provided in correspondence with the plurality of the memory cell array blocks 1 and 2, and that the contents being held are updated for only either one of the row-predecode-signal hold circuits 11 and 12 corresponding to the block select signals $BS_1$ and $BS_2$. With this structure, in the refresh operation of the plurality of memory cell array blocks 1 and 2, by actuating the row address input circuit 9 and the row predecode circuit 10 common to the memory cell array blocks 1 and 2 to cause the block-select-signal generating circuit 13 to select all the blocks, it is made possible to access all of the memory cell array blocks 1 and 2 at a time, so that the plurality of memory cell array blocks 1 and 2 can be refreshed at a time.

At this time, although the row-predecode-signal hold circuits 11 and 12 are actuated, their power consumption is much lower than that of the row address input circuit 9 and the row predecode circuit 10 and unlike the conventional structure, only one pair of the row address input circuit 9 and the row predecode circuit 10 are actuated, so that the reduction in power consumption is achieved.

Additionally, in the normal operation, since the actuation of the row-predecode-signal hold circuits 11 and 12 for holding the output of the row predecode circuit 10 is controlled by the block-select-signal generating circuit 13, the decode operations of the row address input circuit 9 and the row predecode circuit 10 can simultaneously be performed in parallel with the block select operation of the block-select-signal generating circuit 13, so that the speed of the access operation, for example, up to the activation of the word line by the block selection is increased to restrain the reduction in access speed.

When continuous data input and output is performed in a synchronous DRAM having a plurality of memory cell array blocks, the memory speed is increased by eliminating the apparent precharge time not by precharging the entire chip at a time but by alternately and individually precharging the memory cell array blocks on the chip. Specifically, when a semiconductor memory device is divided, for example, into two memory cell array blocks, one memory cell array block is precharged while the other memory cell array block is being accessed.

In the semiconductor memory device where precharging is performed for each of the blocks, considering a case in which different memory cell array blocks are continuously accessed, it is necessary that the row address input circuit 9 and the row predecode circuit 10 of FIG. 1 be initialized while one memory cell array block 1, for example, is being accessed to prepare for the access to the other memory cell array block 2.

Figure 2:
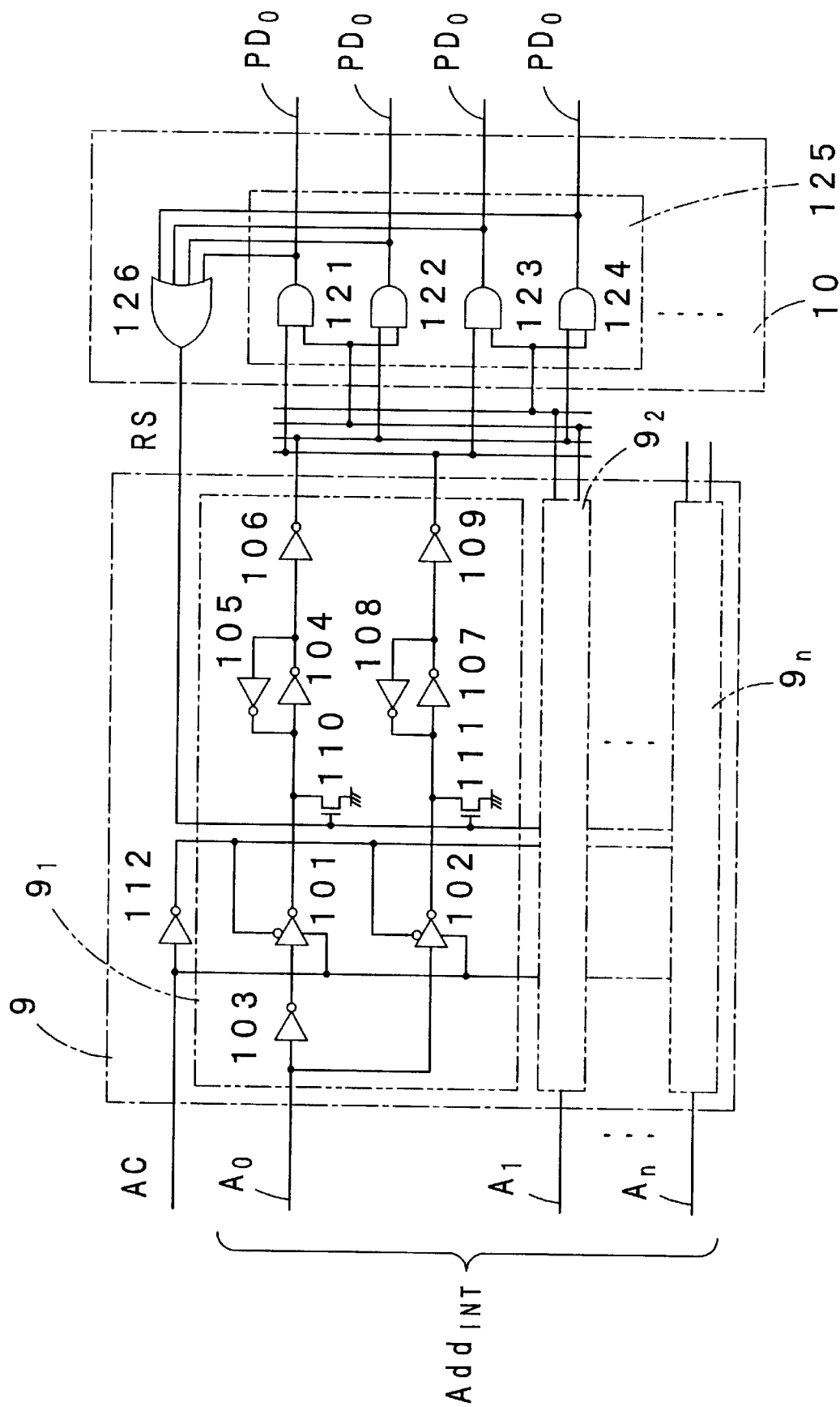
FIG. 2 is a detailed circuit diagram of a row address input circuit and a row predecode circuit in FIG. 1.

The reset signal RS shown in FIG. 1 is the signal for the initialization. Details of a circuit for generating the reset signal RS will be described with reference to FIG. 2. In the circuit of FIG. 2, the reset operation for initializing the row address input circuit 9 and the row predecode circuit 10 is initiated by the predecode signal $PD_0$ which is the output signal of the row predecode circuit 10.

FIG. 2 shows the row address input circuit 9 and the row-predecode circuit 10 in FIG. 1. In FIG. 2, the row address input circuit 9 comprises n row address input circuit units $9_1$ to $9_n$ (n is a given integer) corresponding to n-bit row addresses $A_0$ to $A_n$ in the internal address $Add_{INT}$. The row address input circuit units $9_1$ to $9_n$ have the same structure. The row address input circuit unit $9_1$, for example, is structured so that the holding of the value of an $A_0$-bit address is timed to the address capture signal AC. Specifically, the address input circuit unit $9_1$ includes three-state inverters 101 and 102, inverters 103 to 109, and reset transistors 110 and 111. Reference numeral 112 is an inverter for inverting the address capture signal AC.

The row predecode circuit 10 is provided with the following circuit in correspondence with the number of bits of the row address: a circuit comprising, for example, a 2-bit decoder 125 including four NAND gates 121 to 124, and an OR gate 126 for ORing four outputs (the predecode signals $PD_0$ corresponding to 2 bits of row address) of the 2-bit decoder 125 to generate the reset signal RS and supply it to the row address input circuit units $9_1$ to $9_n$.

Figure 3:
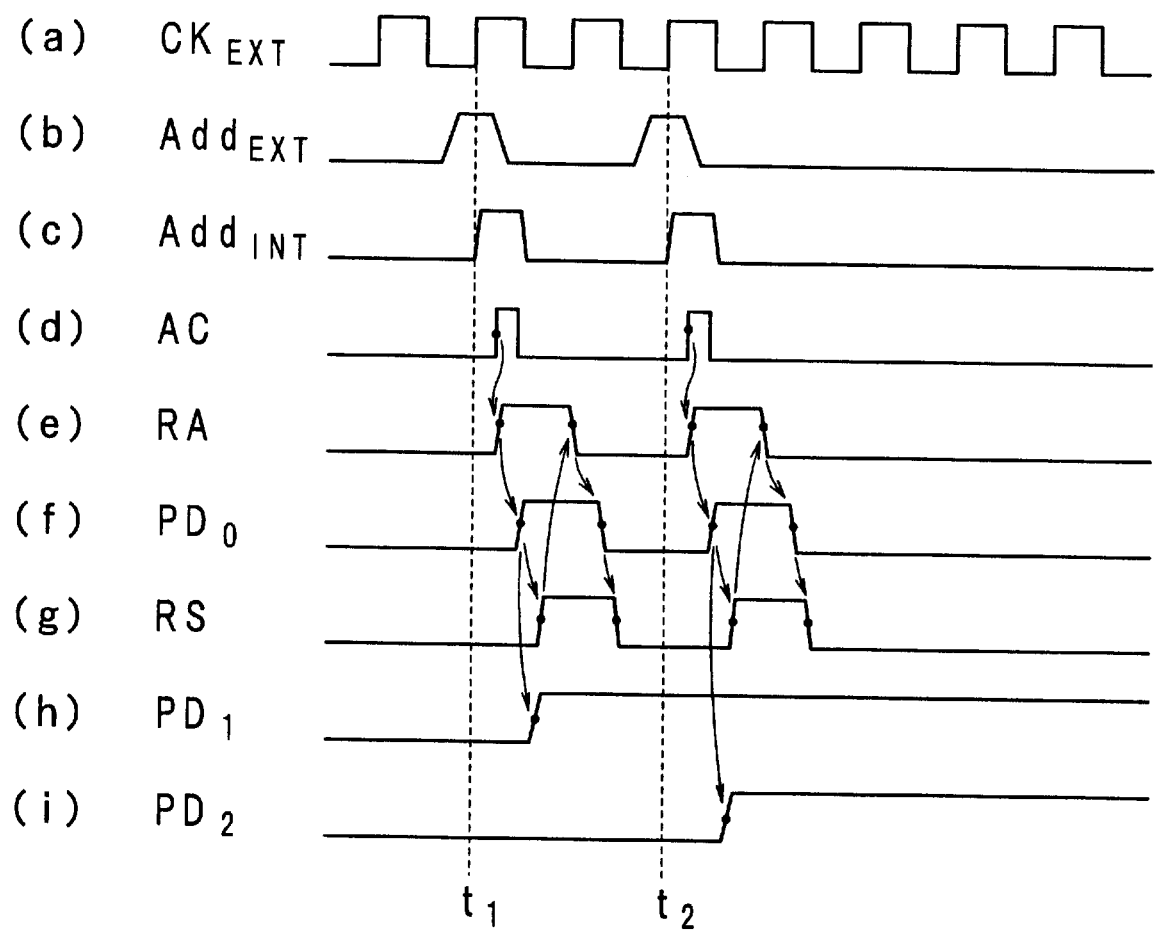
FIGS. 3a–i are timing charts showing an operation timing of the parts of the semiconductor memory device of FIG. 1.

FIG. 3 is a timing chart of the parts of the semiconductor memory device including a reset operation sequence. In FIG. 3, (a) represents the external clock $CK_{EXT}$, (b) represents the external address $Add_{EXT}$, (c) represents the internal address $Add_{INT}$, (d) represents the address capture signal AC, (e) represents the row address RA output from the row address input circuit 9, (f) represents the predecode signal $PD_0$ output from the row predecode circuit 10, (g) represents the reset signal RS, (h) represents the predecode signal $PD_1$ output from the row-predecode-signal hold circuit 11, and (i) represents the predecode signal $PD_2$ output from the row-predecode-signal hold circuit 12.

FIG. 3 shows that the memory cell array block 1 is selected after a time $t_1$ and the memory cell array block 2 is selected after a time $t_2$. At the rising edge of the address capture signal AC, the row address RA of output of the row address input circuit 9 rises, and in response therewith, the predecode signal $PD_0$ rises. At the rising edge of the predecode signal $PD_0$, the reset signal RS rises and the predecode signal $PD_1$ rises. At the rising edge of the reset signal RS, the row address RA of output of the row address input circuit 9 falls, and in response therewith, the predecode signal $PD_0$ falls and the reset signal RS falls.

Now, the reset operation in the timing chart of FIG. 3 will be described in detail. After the address input, one of the predecode signals $PD_0$ is selected (makes a transition to its high level), thereby generating the reset signal RS. By the reset signal RS, the output of the row address input circuit 9 is pulled down to its low level, which first causes the row address RA that is the output of all the row address input circuits 9 to change to its low level, then causes the predecode signal $PD_0$ to change to its low level, and lastly resets the reset signal RS.

During the reset operation, the decode signal of the selected memory cell array block 1 or 2 is captured by the row-predecode-signal hold circuit 11 or 12 and output to the memory cell array block 1 or 2.

In the structure using the predecode signal $PD_0$ serving as the memory cell select signal to initialize the row address input circuit 9 and the row predecode circuit 10, compared with a structure, for example, where the initiation of the reset operation is timed to a delayed signal of another signal (e.g. the internal clock $CK_{INT}$), the number of elements is reduced by the number of elements of the delay circuit, so that the reduction in power consumption is achieved. In addition, since the reset signal is produced by using the predecode signal $PD_0$ so that a reset operation excellent in voltage and temperature dependence is realized, timing design is easy.

What is claimed is:

1. A semiconductor memory device comprising:

a plurality of memory cell array blocks;

one address input circuit for inputting thereto an address common to the plurality of memory cell array blocks;

an address select circuit for outputting a memory cell select signal common to the plurality of memory cell array blocks in correspondence with an address output from the address input circuit;

a block-select-signal generating circuit for generating a block select signal to select one of the plurality of memory cell array blocks; and a plurality of memory-select-signal hold circuits provided for the plurality of memory cell array blocks, respectively, for holding the memory cell select signal and supplying the memory cell select signal being held to the plurality of memory cell array blocks, wherein said plurality of memory-select-signal hold circuits update contents being held in response to the block select signal corresponding to the plurality of memory cell array blocks.

2. A semiconductor memory device as claimed in claim 1, wherein said memory cell select signal of the address select circuit is supplied to the address input circuit as an initialization signal.

3. A semiconductor memory device as claimed in claim 1 or 2, wherein said address input circuit is a row address input circuit and said address select circuit is a row address select circuit.

* * * * *